US011616038B2

(12) United States Patent
Thompson et al.

(10) Patent No.: US 11,616,038 B2
(45) Date of Patent: Mar. 28, 2023

(54) INTERCONNECT FOR ELECTRONIC DEVICE

(71) Applicant: TEXAS INSTRUMENTS INCORPORATED, Dallas, TX (US)

(72) Inventors: Patrick Francis Thompson, Allen, TX (US); Christopher Daniel Manack, Flower Mound, TX (US); Stefan Herzer, Marzling (DE); Rakshit Agrawal, Lewisville, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 27 days.

(21) Appl. No.: 17/094,723

(22) Filed: Nov. 10, 2020

(65) Prior Publication Data

US 2021/0066229 A1 Mar. 4, 2021

Related U.S. Application Data

(63) Continuation of application No. 16/233,841, filed on Dec. 27, 2018, now Pat. No. 10,833,036.

(51) Int. Cl.
*H01L 23/495* (2006.01)
*H01L 23/00* (2006.01)

(52) U.S. Cl.
CPC ........ *H01L 24/14* (2013.01); *H01L 23/49541* (2013.01); *H01L 24/13* (2013.01); *H01L 2224/13013* (2013.01); *H01L 2224/13082* (2013.01); *H01L 2224/13111* (2013.01); *H01L 2224/13147* (2013.01); *H01L 2224/14051* (2013.01)

(58) Field of Classification Search
CPC ... H01L 24/14; H01L 23/49541; H01L 24/13; H01L 2224/13013; H01L 2224/13111; H01L 2224/13082; H01L 2224/13147; H01L 2224/14051
USPC ......................................... 257/666
See application file for complete search history.

(56) References Cited

U.S. PATENT DOCUMENTS

| | | | |
|---|---|---|---|
| 6,197,613 B1 | 3/2001 | Kung et al. | |
| 6,372,622 B1 | 4/2002 | Tan et al. | |
| 7,185,799 B2* | 3/2007 | Pearson | H01L 21/4853 228/180.22 |
| 7,312,529 B2 | 12/2007 | Clevenger et al. | |
| 7,448,119 B2 | 11/2008 | Ozaki | |
| 7,705,476 B2* | 4/2010 | Bayan | H01L 24/15 257/787 |
| 8,193,091 B2 | 6/2012 | Kawai et al. | |

(Continued)

OTHER PUBLICATIONS

PCT International Search Report International Application No. PCT/US 2019/068046, dated Mar. 26, 2020, 2 pages.

*Primary Examiner* — Vu A Vu
(74) *Attorney, Agent, or Firm* — Dawn Jos; Frank D. Cimino

(57) ABSTRACT

A semiconductor die includes a substrate and an integrated circuit provided on the substrate and having contacts. An electrically conductive layer is provided on the integrated circuit and defines electrically conductive elements electrically connected to the contacts. Electrically conductive interconnects coupled with respective electrically conductive elements. The electrically conductive interconnects have at least one of different sizes or shapes from one another.

16 Claims, 4 Drawing Sheets

(56) References Cited

U.S. PATENT DOCUMENTS

| | | | |
|---|---|---|---|
| 8,921,986 B2 * | 12/2014 | Dix | H01L 24/14 |
| | | | 257/673 |
| 9,373,539 B2 | 6/2016 | Uehling et al. | |
| 9,397,633 B2 | 7/2016 | Ochiai et al. | |
| 9,515,039 B2 * | 12/2016 | Lai | H01L 24/14 |
| 9,530,746 B2 | 12/2016 | Kiyono et al. | |
| 9,823,279 B2 | 11/2017 | Jackson | |
| 2004/0007779 A1 | 1/2004 | Arbuthnot et al. | |
| 2012/0061823 A1 | 3/2012 | Wu et al. | |
| 2012/0153458 A1 | 6/2012 | Howard et al. | |
| 2014/0231992 A1 | 8/2014 | Ding et al. | |
| 2016/0284629 A1 | 9/2016 | Shea | |

\* cited by examiner

INTERCONNECT FOR ELECTRONIC DEVICE

This application is a continuation of U.S. patent application Ser. No. 16/233,841, filed Dec. 27, 2018, the contents of which are herein incorporated by reference in its entirety.

SUMMARY

In one example, a semiconductor die includes a substrate and an integrated circuit provided on the substrate and having contacts. An electrically conductive layer is provided on the integrated circuit and defines electrically conductive elements electrically connected to the contacts. Electrically conductive interconnects coupled with respective electrically conductive elements. The electrically conductive interconnects have at least one of different sizes or shapes from one another.

In another example, an electronic package includes a die having a substrate and an integrated circuit provided on the substrate. The integrated circuit includes contacts. An electrically conductive layer is provided on the integrated circuit and defines electrically conductive elements electrically connected to the contacts. Electrically conductive interconnects coupled with respective electrically conductive elements. The electrically conductive interconnects have at least one of different sizes or shapes from one another. A leadframe is secured to the electrically conductive interconnects.

Other objects and advantages and a fuller understanding of the invention will be had from the following detailed description and the accompanying drawings.

DETAILED DESCRIPTION

Figure 1:
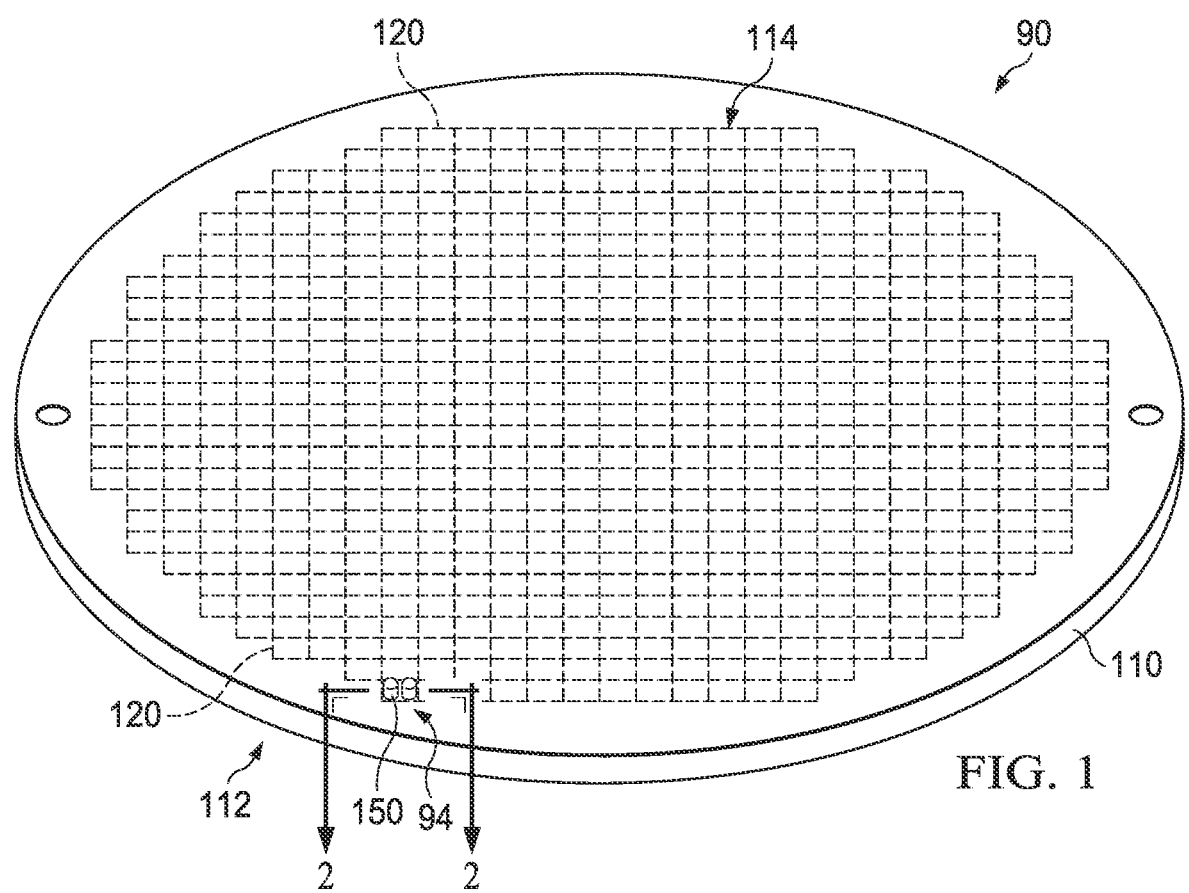
FIG. 1 is a perspective view of an example wafer for forming an electronic device.

FIG. 1 illustrates an example wafer 90 used to form an electronic device. The electronic device can be, for example, a wafer-level chip scale package (WLCSP) of integrated circuits. Alternatively, the electronic device can be on the chip or die scale, PCB scale or panel scale or an electronic package. Consequently, the electronic device can be on the millimeter size scale or up to several feet in size.

Figure 2:
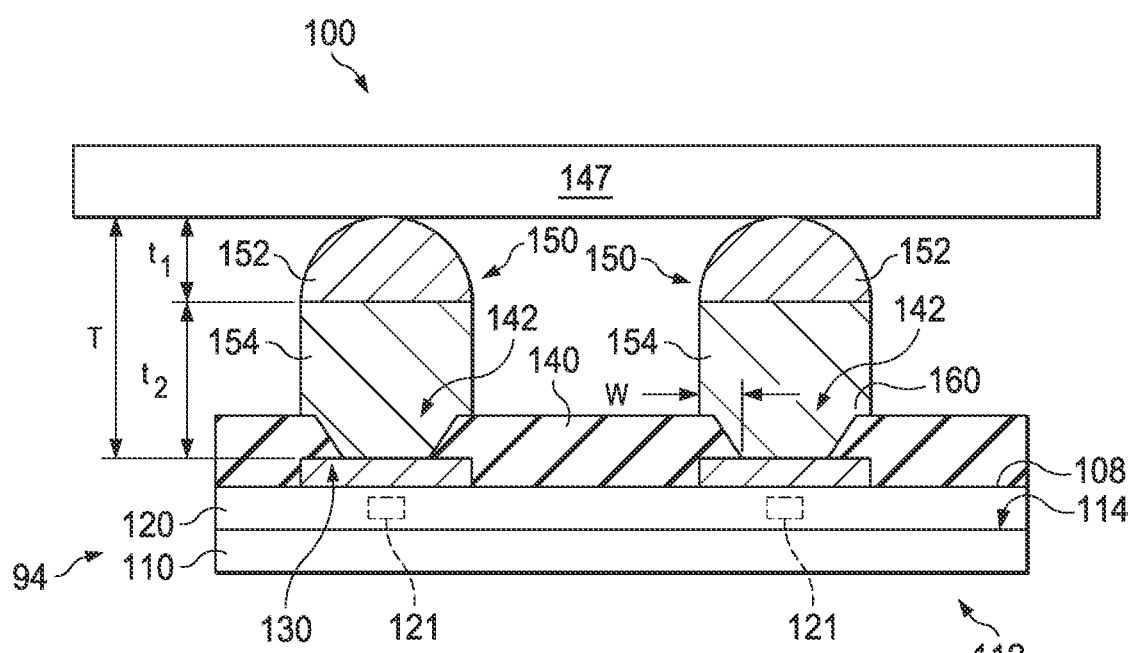
FIG. 2 is a section view taken along line 2-2 of FIG. 1 and showing a die.

As shown, the wafer 90 includes a substrate 110 having a first side 112 and a second side 114. The substrate 110 can be circular and have a diameter of about, for example, 200 or 300 mm. Alternatively, the substrate 110 can be square or rectangular (not shown). The substrate 110 can be formed from a semiconductor material, such as silicon. The wafer 90 is diced, e.g., by stealth dicing, to singulate the wafer into individual dies 94 (FIG. 2). The dies 94 when connected to a leadframe 147, form an electronic package or device 100.

Within each die 94 integrated circuits 120 are fabricated or otherwise provided on the second side 114 of the substrate 110. The integrated circuits 120 include one or more contacts shown schematically at 121. The integrated circuits 120 can be arranged in a grid or array equidistantly spaced from one another about the second side 114. Depending on the sizes of the substrate 110 and integrated circuits 120, thousands or tens of thousands of integrated circuits can be fabricated on the second side 114 of the substrate. Each integrated circuit 120 includes a surface or side 108 facing away from the substrate 110.

Figure 3A:
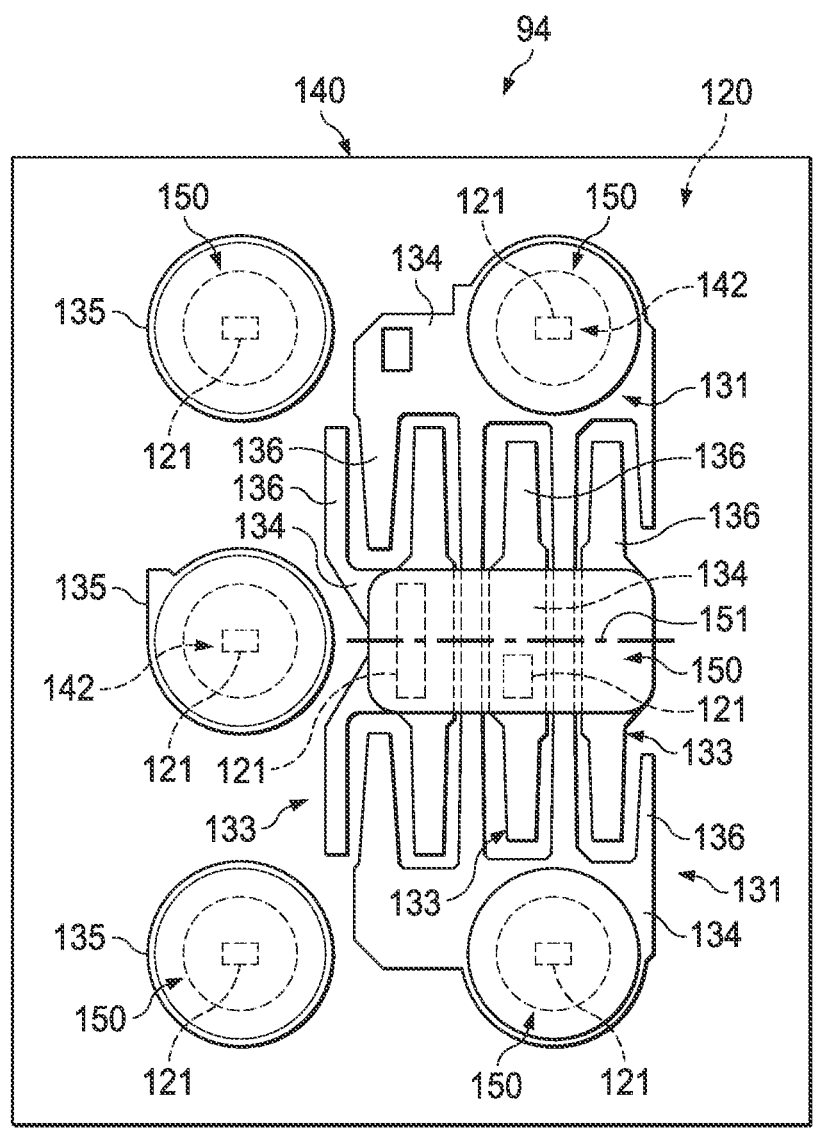
FIG. 3A is a schematic illustration of electrically conductive elements contacted by electrically conductive interconnects in the die.

Referring to FIGS. 2 and 3A, a layer 130 of electrically conductive material is provided on the side 108 of the integrated circuits 120 and defines one or more electrically conductive first, second, and third elements 131, 133, 135 for redistributing and/or routing power. The layer 130 can be formed from a metal, such as copper or aluminum. The elements 131, 133, 135 can include electrically conductive lines and/or electrically conductive contacts formed in different patterns.

As shown in FIG. 3A, the elements 131, 133 are formed as first and second lines. The elements 135 are formed as contacts. Other permutations and combinations of lines and contacts are contemplated. Each element 131, 133 is electrically connected to one or more of the contacts 121 through vias (not shown) in the integrated circuit. Each element 131, 133 can include at least one base 134 and a plurality of fingers 136 extending from each base in one or more directions. The base 134 can have a polygonal shape, e.g., square, rectangular or trapezoidal. The fingers 136 can be generally rectangular and have a length extending away from the base 134 that greater than the width. The element 131 shown includes a pair of bases 134 and fingers 136 extending between the bases. At least some fingers 136 extend between and interconnect the bases 134.

Each element 133 includes a base 134 and fingers 136 extending from the base. In one example, the fingers 136 extend in opposite directions from the base 134. The base 134 can have a polygonal shape, e.g., square, rectangular or trapezoidal. The fingers 136 can be generally rectangular and have a length extending away from the base 134 that greater than the width. The elements 133 are positioned between the fingers 136 of the element 131 and are electrically isolated from one another and from the element 131. In one example, the elements 133 are interdigitated with the fingers 136 of the element 131. The elements 135 can be round or square and are each electrically connected to a corresponding contact 121 in the integrated circuit 120 through a via (not shown). The elements 135 are electrically isolated from one another and from the elements 131, 133.

Referring to FIG. 2, a layer 140 of material extends over the layer 130 and covers the entire side 108 of each integrated circuit 120. The layer 140 is formed from an electrically insulating material such as polyimide. One or more slots or openings 142 extend entirely through the insulating layer 140 to expose portions of the layer 130, namely, to expose the elements 135 and portions of the elements 131, 133. It will be appreciated, however, that the layer 140 can be omitted (not shown).

The openings 142 can be sized and shaped to expose different portions of the same element 131 or 133 or portions of different elements 131, 133. To this end, the openings 142 can be aligned with the bases 134 and/or fingers 136 of the elements 131, 133. Each opening 142 can have a cross-sectional area that varies along its depth or have a constant cross-sectional area (not shown). As shown, each opening 142 has a cross-sectional area that increases in a direction extending away from the layer 130.

Figure 3B:
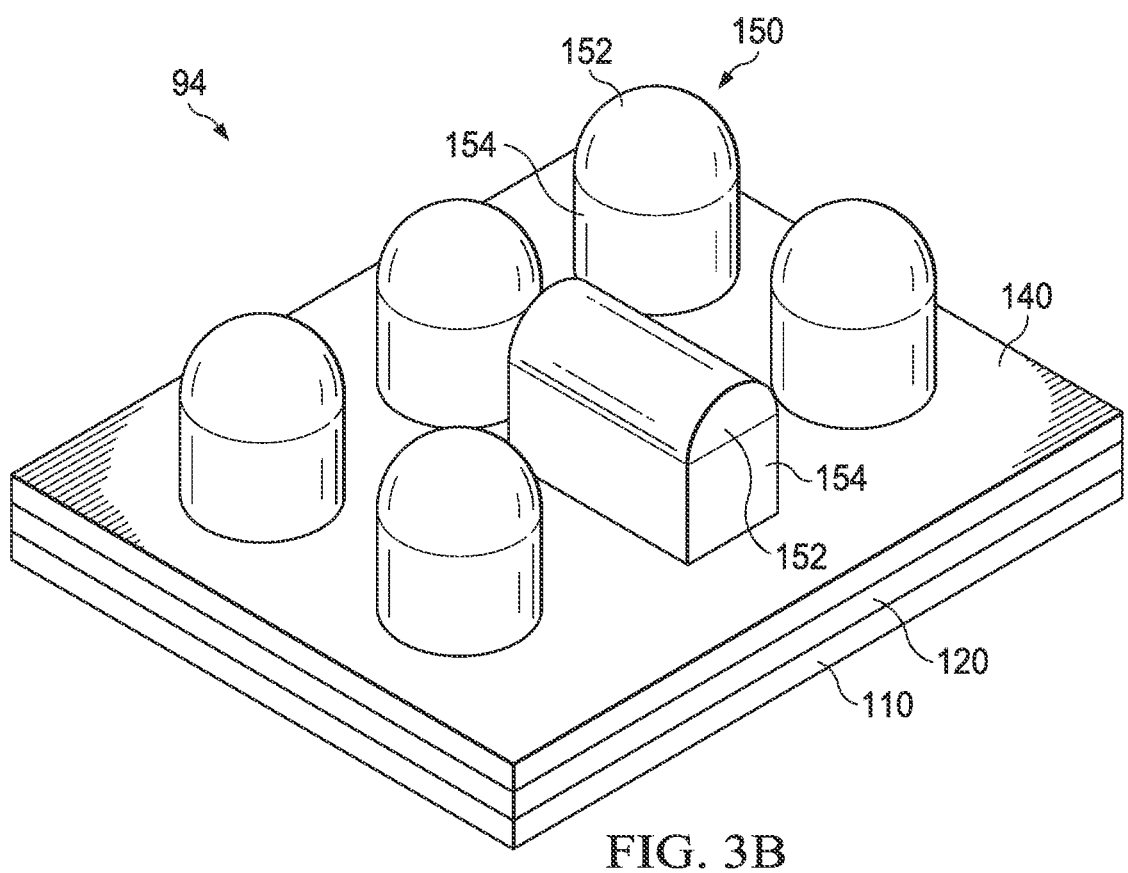
FIG. 3B is a perspective view of FIG. 3A.

Referring further to FIG. 3B, electrically conductive interconnects 150 extend through each opening 142 (when present) into contact with the elements 135 and the exposed portions of the elements 131, 133. Each interconnect 150 includes a first portion or bump 152 and a second portion or post 154 positioned between the first portion and the respective elements 131, 133, 135. Alternatively, the first portion 152 can be omitted (not shown). Each second portion 154 engages an element 135 or portions of the elements 131, 133 exposed by the associated opening 142. It will be appreciated that although interconnects 150 are only illustrated on a single integrated circuit 120 in FIG. 1 any number of the integrated circuits on the substrate 110 can include any number of interconnects.

The first portion 152 can be formed from a conductive material such as tin solder, e.g., SnAg or NiSnAg, that undergoes solder reflow to secure the die 94 to the leadframe 147. With this in mind, the leadframe 147 can be secured to the dies 94 prior to singulation of the wafer 90 into dies. As a result, portions of the leadframe 147 are cut off during singulation and the remainder of the leadframe remains in the electronic device after singulation. The leadframe 147 may therefore not have a frame shape in the electronic device.

In any case, the second portion 154 can be formed from a conductive material such as copper. The first portion 152 can have a thickness $t_1$ of about 5-30 μm. The second portion 154 can have a thickness $t_2$ of about 25-55 μm. The interconnect 150 can have an overall thickness T of about 60 μm. The thickness T of the interconnect 150 can be different from the width, which extends perpendicular to the thickness (left to right as shown), i.e., the thickness can be greater or less than the width. The interconnect 150 can be formed by electroplating the first and second portions 152, 154 directly onto the insulating layer 140 and through the openings 142 into contact with the elements 135 and the exposed portions of the elements 131, 133. The interconnect 150 can have an overhang or lip 160 that engages the insulating layer 140 outside the opening 142. In other words, the interconnect 150 can have a larger footprint than the opening 142 and extend entirely around or encircle the opening from above (as shown). The lip 160 can have a width w of about 25 μm relative to the smallest cross-sectional area of the opening 142 at the layer 130.

The interconnects 150 can have a wide range of shapes and sizes on each integrated circuit 120. In particular, the interconnect 150 can have any shape or cross-section, e.g., square or rectangular (see FIG. 3), circular, polygonal and/or elongated, with any number of straight and/or curved sides. The interconnects 150 associated with a single integrated circuit 120 can have different sizes and/or different shapes from one another. In one example, the interconnect 150 can have a width of about 150-500 μm and a length of about 150-500 μm. The interconnect 150 can have an aspect ratio of at least 1:1 and up to about 5:1. Regardless, the interconnect 150 completely fills each opening 142 and the shape of the interconnect is defined by the shape of the opening. That said, configuring an opening 142 to expose particular portions of the elements 131, 133 readily enables the interconnect 150 extending into the opening to contact those exposed portions.

With this in mind, the shapes of the openings 142 in the insulating layer 140 allow the interconnects 150 to contact to any number of elements 131, 133, 135. In the example shown in FIG. 3A, five openings 142 in the insulating layer 140 allow five interconnects 150 to contact the individual, exposed elements 135 formed as contacts. The interconnects 150 contacting the elements 135 can be circular, round or square (not shown).

Another, elongated opening 142 exposes the fingers 136 on the element 131 and the bases 134 of multiple elements 133. The interconnect 150 electroplated through this opening 142 therefore contacts the fingers 136 on the element 131 as well as the bases 134 of the elements 133. Consequently, the elements 131, 133, which would otherwise be electrically isolated from one another, are now electrically connected to one another by the interconnect 150. Accordingly, multiple contacts 121 within the same integrated circuit 120 that are electrically connected to the exposed elements 131, 133 are electrically connected to one another. This is desirable when, for example, multiple integrated circuits 120 are intended for the same integrated circuit once the electronic device 100 is diced or when it is desirable to increase power delivery to one or more integrated circuits.

It will be appreciated that a single interconnect 150 can extend into multiple, discrete openings 142 to electrically connect spaced-apart portions of the elements 131, 133 (not shown). In any case, the openings 142 throughout the insulating layer 140 are sized and shaped to expose portions of the layer 130 such that providing interconnects 150 in the openings will electrically connect contacts 121 within a single integrated circuit 120. This is repeated across all the integrated circuits 120 on the electronic device 100 in a desired manner.

Figure 4:
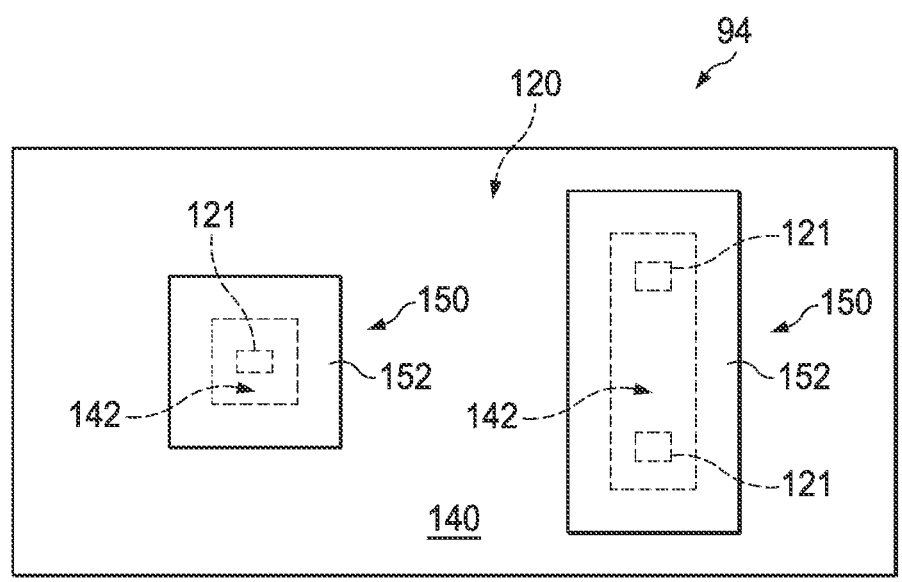
FIG. 4 is a top view of another example electronic device

To this end, in another example die 94 shown in FIG. 4, a pair of interconnects 150 are provided on the surface 108 for three contacts 121 in the die. A first, generally square interconnect 150 extends through a similarly shaped opening 142 in the insulating layer 140 to allow the interconnect to contact an exposed element 135 aligned with the opening (not shown). A second, generally rectangular interconnect 150 extends through a similarly shaped opening 142 in the insulating layer 140 to allow the interconnect to contact portions of multiple elements 131, 133 aligned with the opening (not shown).

Figure 5:
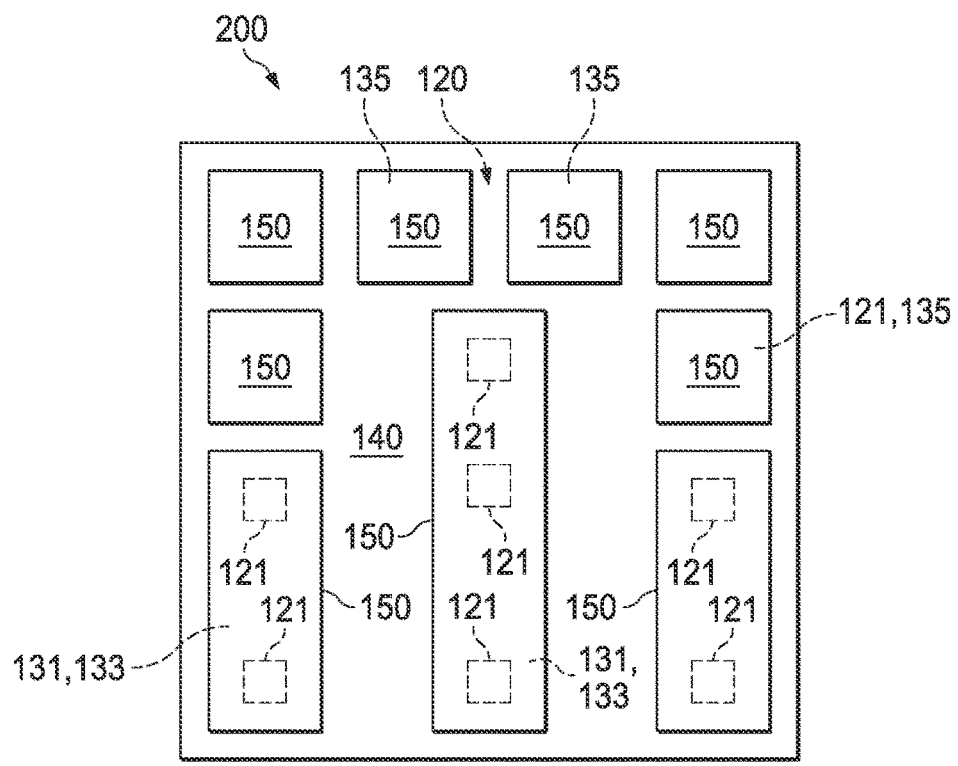
FIG. 5 is a top view of another example electronic device.

In another example electronic device configuration shown in FIG. 5, the electronic device is a die 200 formed by segmenting the wafer 90 by dicing, e.g., by stealth dicing. Nine interconnects 150 are provided on the surface 108 for thirteen contacts 121 in the die 94. Five interconnects 150 are square and contact the elements 135. The remaining interconnects 150 are elongated and contact portions of multiple elements 131, 133.

Figure 6:
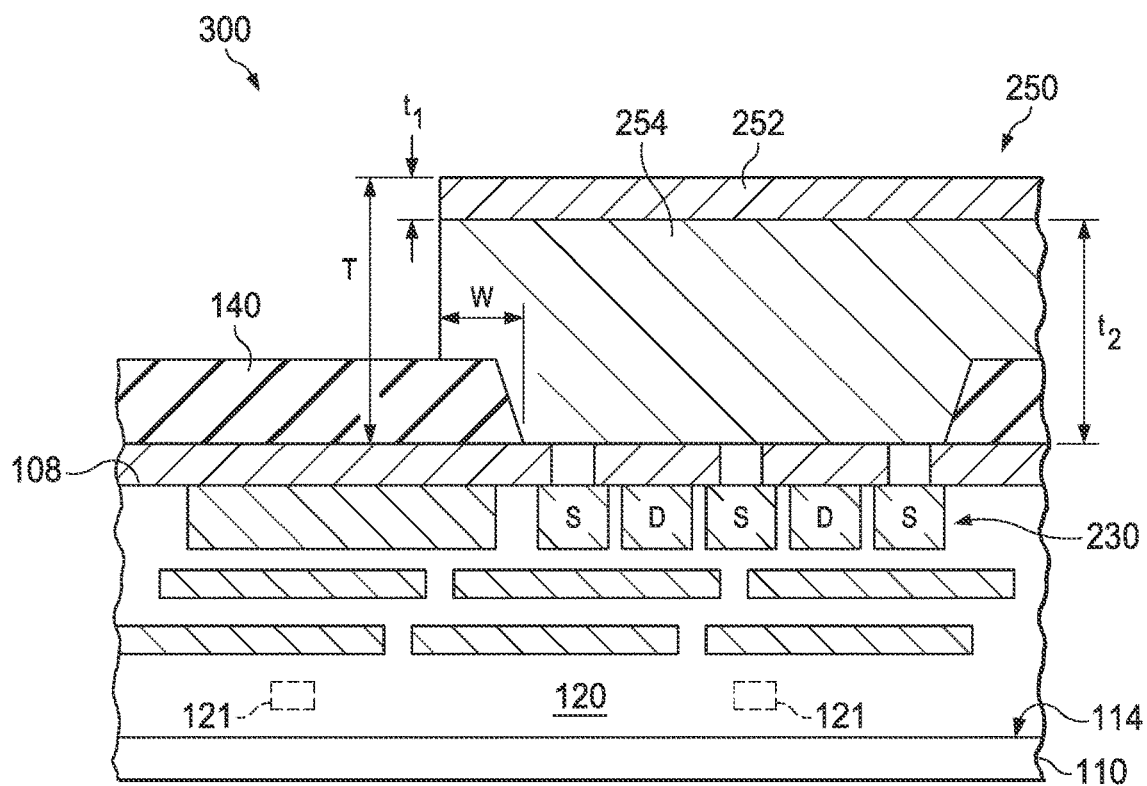
FIG. 6 is a section view of yet another example electronic device.

In another example shown in FIG. 6, the electronic device is a WLCSP 300 for a high current application. Consequently, the conductive material is formed in multiple layers 230 within the substrate 110. The layers 230 can be formed from damascene copper and define one or more field effect transistors including a gate (not shown), drain (D), and source (S). The layers 230 are arranged through the thickness of the integrated circuit 120 and cooperate with vias (not shown) to electrically connect contacts 121 within the integrated circuits 120 to one another and electrically connect the structures to the interconnects 250.

The ability to form the interconnects 150, 250 into multiple sizes and/or shapes advantageously allows the interconnects to transfer power to the integrated circuits 120 at an increased level. More specifically, a single interconnect 150 can contact the conductive layer 130 over a larger surface area than conventional spherical solder balls, thereby allowing more power to flow through a single interconnect to the contacts 121 in the integrated circuit 120 electrically connected therewith. The frequency of the encoded messages that can be passed through the layer 130/interconnect 150, 250 interface is therefore increased.

In one example, the interconnects 150, 250 can increase the $V_{ss}$ area by at least 80%, the I/O area by at least 30%, the $V_{in}$ area by at least 100% and the $V_{sw}$ area by at least 120% compared to the area afforded by spherical solder balls. As a result, the interconnects 150, 250 can be designed to maximize the size of power and logic interconnections in the electronic device without increasing the size of the associated integrated circuit(s) 120 or violating surface mount technology capability. The interconnects 150 described herein can therefore used for power devices.

The non-circular interconnects 150, 250 described herein can also advantageously alleviate or substantially reduce the conductive layer routing within the substrate normally required by conventional, spherical solder connections. In particular, some existing electronic devices require multi-level conductive metal routing within the substrate to electrically connect multiple integrated circuits on the opposing side of the substrate. On the other hand, the conductive interconnects described herein are capable of contacting multiple, electrically isolated contacts or structures within a single integrated circuit in an efficient, cost-effective manner.

Additionally, the interconnects 150, 250 can have a reduced thickness compared to spherical interconnects, which results in improved thermal performance as greater heat transfer occurs through the thinner, non-circular interconnect. More specifically, a shorter interconnect provides less resistance and produces less heat loss. Consequently, the interconnects 150, 250 described herein can increase the flexibility in electrical routing to improve the electromigration resistance and thermal efficiency of the electronic device while increasing key interconnection areas between the interconnects and electrical elements. The interconnects also allow for a more efficient use of the substrate space for functional devices.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An electronic package comprising:
   a substrate including conductive elements electrically connected to an integrated circuit of the substrate, a portion of at least one of the conductive element in between fingers of another conductive element;
   at least two conductive interconnects, each electrically coupled to the integrated circuit via the conductive elements, wherein the at least two conductive interconnects include different size and shape from one another, and wherein each of the at least two conductive interconnects include a first portion including tin and a second portion of copper, the second portion attached to the conductive elements, wherein one of the at least one of the two conductive interconnects is electrically connected to one of the conductive elements; and
   a portion of a leadframe attached to the first portion of each of the at least two conductive interconnects.

2. The electronic package recited in claim 1, wherein one of the at least two conductive interconnects has a thickness extending away from the conductive elements greater than a width extending perpendicular to the thickness.

3. The electronic package recited in claim 1, wherein at least one of the conductive interconnects is polygonal in shape.

4. The electronic package recited in claim 1, wherein at least one of the conductive interconnects is rectangular in shape.

5. The electronic package recited in claim 1, wherein at least one of the conductive interconnects has an aspect ratio greater than 1:1.

6. The electronic package recited in claim 1, further comprising an insulating layer provided over the substrate and in between the at least two conductive interconnects.

7. The electronic package recited in claim 1, wherein the second portion has a thickness of about 25-55 μm.

8. The electronic package recited in claim 1, wherein at least one of the conductive interconnects has a thickness of about 60 μm.

9. The electronic package recited in claim 1, wherein the first portion includes SnAg or NiSnAg.

10. An electronic package comprising:
    a substrate including conductive elements electrically connected to an integrated circuit of the substrate, each of the conductive elements including a base and fingers extending from the base, the fingers of each of the conductive elements interdigitated with each other; and
    at least two conductive interconnects, each electrically coupled to the integrated circuit via the conductive elements, wherein the at least two conductive interconnects include different size and shape from one another, and wherein one of the at least one of the two conductive interconnects is electrically connected to one of the conductive elements.

11. The electronic package recited in claim 10, wherein the one of the at least two conductive interconnects includes substantially a rectangular shape from one view of the electronic package.

12. The electronic package recited in claim 10, wherein each of the at least two conductive interconnects include a first portion of tin and a second portion of copper, the second portion attached to the conductive elements.

13. The electronic package recited in claim 12 further comprising a portion of a leadframe attached to the first portion of each of the at least two conductive interconnects.

14. The electronic package recited in claim 10 further comprising a layer of polyimide between at least two conductive interconnects from at least one view of the electronic package.

15. The electronic package recited in claim 10, wherein the one of the at least two conductive interconnects transfers power to the electronic package.

16. The electronic package recited in claim 10, wherein the package is a wafer level chip scale package (WLCSP).

* * * * *